United States Patent [19]

Duthoit et al.

[11] Patent Number: 4,621,192

[45] Date of Patent: Nov. 4, 1986

[54] DEVICE FOR MEASURING THE GRADIENT OF A MAGNETIC FIELD BY THE MAGNETOOPTICAL EFFECT

[75] Inventors: Francois Duthoit, Brest; Bernard Desormiere, Plougonvelin Le Conquet, both of France

[73] Assignee: Thomson-CSF, Paris, France

[21] Appl. No.: 656,329

[22] Filed: Oct. 1, 1984

[30] Foreign Application Priority Data

Oct. 4, 1983 [FR] France ................. 83 15791

[51] Int. Cl.[4] ............................................. G02F 1/01
[52] U.S. Cl. ................. 250/225; 250/231 R; 324/244
[58] Field of Search ............ 250/225, 231, 227; 324/244, 96; 356/368; 350/375, 377

[56] References Cited

U.S. PATENT DOCUMENTS 3,272,988 9/1966 Bloom et al. ............... 350/377
3,927,947 12/1975 Kasai ....................... 356/368

OTHER PUBLICATIONS

The Review of Scientific Instruments, vol. 32, No. 4, Avril 1961, pp. 444-448, New York (USA); R. M. Morris et al.: "Design of a Second Harmonic Flux Gate Magnetic Field Gradiometer", *FIG. 3; p. 445.

Primary Examiner—David C. Nelms
Assistant Examiner—James G. Gatto
Attorney, Agent, or Firm—Oblon, Fisher, Spivak, McClelland & Maier

[57] ABSTRACT

A device for measuring the gradient of a magnetic field comprises on the same support two magnetooptical layers separated by a half-wave plate. A linearly polarized light beam successively passes through these three optical components and its polarization plane rotates by a value proportional to the gradient of the field in its propagation direction.

6 Claims, 5 Drawing Figures

DEVICE FOR MEASURING THE GRADIENT OF A MAGNETIC FIELD BY THE MAGNETOOPTICAL EFFECT

BACKGROUND OF THE INVENTION

The present invention relates to a device for measuring the gradient of a magnetic field utilizing the action of a magnetooptical medium on a polarized light beam, known as the Faraday effect.

Such a device, which will be referred to hereinafter as magnetic field gradientmeter measures the variation in space of the module of the magnetic field, or one of its components in a given direction. If $h_1$ and $h_2$ are values of the components of the field measured at a distance d in said direction, the component of the gradient is given by the linear approximation:

$$(h_2-h_1)/d$$

which applies for a spatial slow variation of the field with respect to distance d.

According to the prior art, the gradientmeters are produced by combining two magnetometers from which the two output signals are taken. The practical limit of the measurement of a magnetic gradient is then imposed by the precision of the alignment of the axes of these two pickups, and by the accuracy of the measurement of each pickup, the distance d being given. For example, if it is wished to measure a variation of 1 nT of the east-west component of a natural magnetic anomaly which is small compared with the earth's field ($5.10^4$ nT in Europe), the parallelism of the measurement must be effected at better than 4 angular seconds.

It is known to produce very highly performing low weight gradientmeters, at least with respect to the sensitive part, by using SQUID (Superconducting Quantum Interference Device). They suffer from the disadvantage of having to be kept at a very low temperature of approximately 4° K. and the associated cooling device is prohibitive from the consumption and overall dimensions standpoints.

Gradientmeters with a low consumption and accpetable overall dimensions have been produced by using two magnetometers of the saturatable core type, called "fluxgate", which are connected differentially. Although the local measurement of the field is sufficiently accurate for measuring low gradients, e.g. 1 nT/m, these gradientmeters suffer from the disadvantage of having a not sufficiently accurate respective positioning of the two magnetic cores, leading to an error-prone gradient measurement, particularly due to the aforementioned parallelism deficiency. The generally adopted solution consists of making the most stable possible assembling and then correcting by calibration or fitting magnetic masses the said alignment deficiency, which represents a source of complexity and lack of fidelity in the measurements.

Moreover, it is known to measure a magnetic field by means of a so-called optical magnetometer using the Faraday effect. For this purpose, a polarized light beam passes through a magnetooptical medium, which rotates the polarization plane by a value proportional to the value of the magnetic field along the propagation direction. An a.c. magnetic field is superimposed on this direction so as to obtain, after detection, filtering and negative feedback, an automatic measurement of the algebraic value of the component of the field in this direction.

Thus, a ferrimagnetic material layer traversed by a polarized light beam rotates the polarization field by an angle $\theta$, called the Faraday rotation and given by the relation:

$$\theta = \theta_o L(h/Hs) \qquad (1)$$

in which $\theta_o$ is a specific rotation coefficient, h is the component of the local magnetic field parallel to the light propagation direction, Hs is the field in the plane of the layer perpendicular to the propagation direction, called the saturation field and L is the length of the layer in the propagation direction.

In order to obtain the measurement of field h, a sinusoidal field $h(t) = h_o \sin \omega t$ in the propagation direction is superimposed on the field to be measured. By detecting the light transmitted across a crossed analyzer with the incident polarization, an electrical signal is obtained, whose fundamental is proportional to h.

The magnetooptical effect described by relation (1) assumes that the magnetooptical layer is relatively thick and specifically a few dozen microns, so as to remain within the approximation of the geometrical optics.

SUMMARY OF THE INVENTION

The gradientmeter according to the invention has two magnetooptical media traversed by the polarized light from a single light source, which is preferably a laser. Thus, the measurement direction is materialized by the direction of the light beam, which eliminates one cause of parallelism defects. The difference between the local fields is obtained optically.

According to a preferred embodiment, the two magnetooptical media are simultaneously produced by epitaxy on a single crystalline substrate of an epitaxial crystalline layer having a composition such that the magnetization is spontaneous in the plane of the layer. This epitaxy on a single substrate makes it possible to obtain an alignment quality of the two media which is that of the reference plane of the substrate (generally a half-wave length). It is also known that for a single medium formed by a 5 mm long layer in the direction of the light beam, it is possible to measure a field of 0.01 nT.

The accuracy of the measurement of each local field and the reduced size of each magnetooptical medium consequently makes it possible to obtain a sensitive gradientmeter of limited overall dimensions by moving together the two sensitive media. Moreover, in its preferred form, the usual gradientmeter defects, namely the non-identity between the two media and the alignment deficiency, are reduced to minimum values.

BRIEF DESCRIPTION OF THE DRAWINGS

The invention is described in greater detail hereinafter relative to non-limitative embodiments and the attached drawings, wherein show.

DESCRIPTION OF THE PREFERRED EMBODIMENTS

Figure 1:
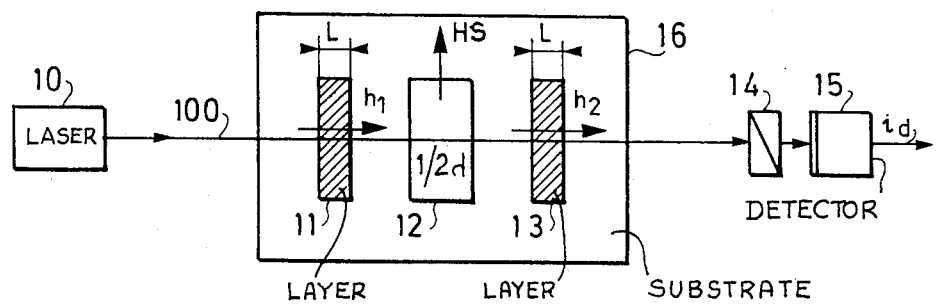
FIGS. 1 and 2 diagrammatic plan and side views of a gradientmeter according to the invention.
Figure 2:
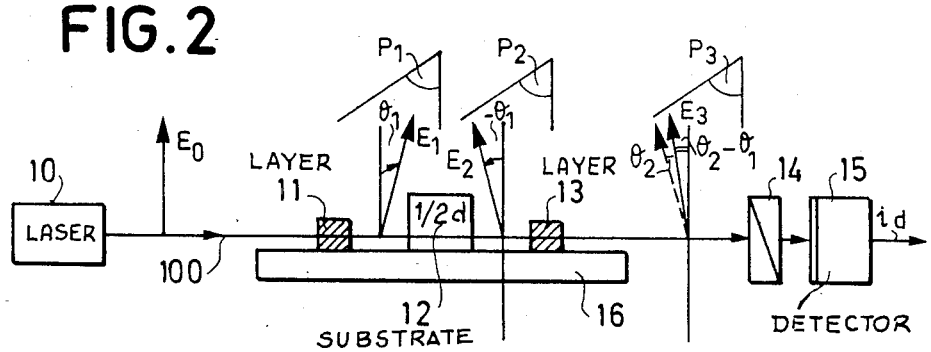

In FIGS. 1 and 2, the pickups 11 and 13 carried by substrate 16 are thick layers (relative to the wavelength used) of ferrimagnetic material. A laser 10 emits a light beam 100, which is linearly polarized in a direction $E_o$ (by convention that of the electrical field of the electromagnetic wave). This beam successively passes through the first magnetooptical layer 11, a half-wave plate 12, whereof one of the two neutral axes is parallel to the initial polarization of the beam, the second magnetooptical layer 13 identical to the first one and an analyzer 14 crossed with the incident polarization. It then reaches a photodetector 15, which supplies a output signal $i_d$.

The two layers have the same width L and are joined to the same planar support 16. They are deposited on the surface of the said support. A permanent saturation field $H_s$ is located in the plane of the layers and perpendicular to the propagation direction. It can e.g. be produced by appropriately positioned permanent magnets, or can be obtained by mechanically stressing the magnetooptical layer.

The light emitted by a laser is generally naturally polarized and it is then sufficient to orient it in the correct direction. In the opposite case, use will be made of an adequate polarizer between the laser and the first layer. Light beam 100 undergoes a first Faraday rotation $\theta_1$ on passing through the first layer 11 of width L, due to the local field $h_1$ existing in the propagation direction. The value of this rotation is $\theta_1 = Kh_1$ in which K is a constant, of value $\theta_o L/Hs$.

The beam then passes through the half-wave plate 12, whereof one of the two neutral axes is positioned parallel to $E_o$. Under the influence of this plate, the polarization $E_2$ of the beam leaving this plate is symmetrical to the polarization $E_1$ entering the same with respect to the neutral lines of the plate, so that it forms an angle $-\theta_1$ with the direction of $E_o$.

The light beam then undergoes a second Faraday rotation $\theta_2$ on passing through the second layer 13 of width L, which is proportional to the local field $h_2$ in the propagation direction, so that its value is $\theta_2 = Kh_2$. The final polarization obtained $E_3$ forms an angle $-\theta_1 + \theta_2$ with the direction of $E_o$. Thus, there has been an optical subtraction of the effects of the two fields in a perfectly linear direction.

The vectors $E_1$, $E_2$, $E_3$ representing these polarizations in the planes $P_1$, $P_2$, $P_3$ perpendicular to the direction of the light beam and located after the outlet from the layers and the half-wave plate are shown in FIG. 2, with their angles $\theta$ with respect to the direction of $E_o$.

Following the second layer 13, the light beam passes through an analyzer 14 crossed with respect to the incident polarization $E_o$. On leaving this analyzer, it excites a photodetector 15 with an optical powder P given by the relation:

$$P = P_o \sin^2(\theta_2 - \theta_1) \exp(-2La)$$

in which $P_o$ is the incident power supplied by the laser and a the absorption of the different media traversed.

On leaving this photodetector, a signal is consequently obtained, whose intensity $i_d$ is proportional to:

$$\sin^2(\theta_2 - \theta_1) \simeq (\theta_2 - \theta_1)^2 = K(h_2 - h_1)^2$$

i.e. proportional to the square of the component of the field gradient in the propagation direction.

Figure 3:
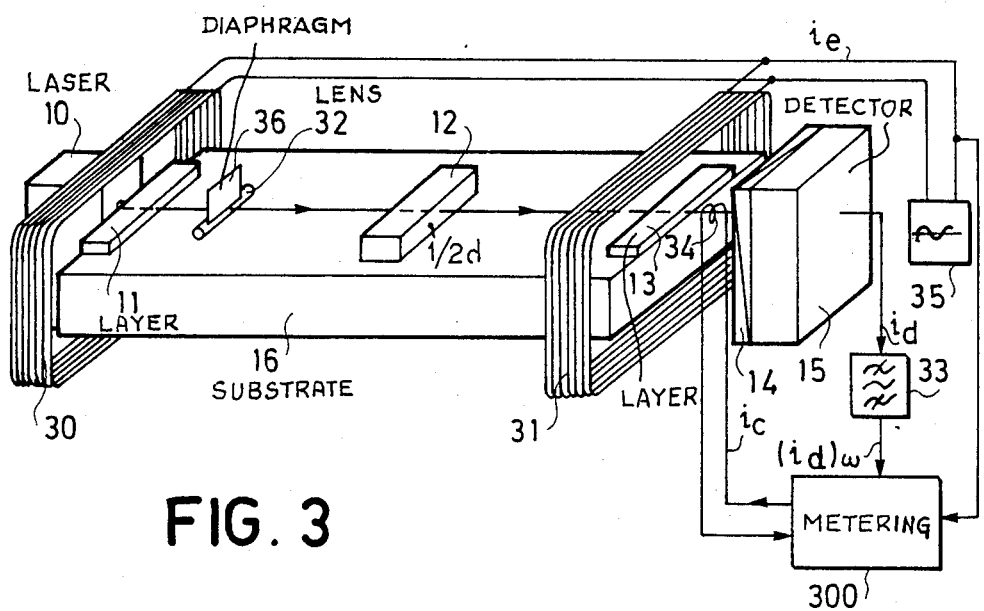
FIG. 3 a perspective view of a preferred embodiment of the invention.

In the preferred embodiment of FIG. 3, the permanent magnets producing the saturation field $H_s$ have been omitted in order to make the drawing easier to understand.

In this case, laser 10 is a semiconductor laser of the polarized junction type, known as a "laser diode". The dimensions of the emissive surface of such a laser are very small, which makes it possible to transmit the light beam directly into the first layer 11 by placing the said emissive surface against the edge of the layer, whose thickness of approximately 30 microns corresponds to a so-called thick layer. Apart from the advantage of reduced overall dimensions, laser diodes have the advantage of consuming little energy. Thus, for example, they only require a threshold current of 5 mA.

In a constructional variant, the light emitted by the laser diode can be brought up to the first layer with the aid of a monomodal optical fibre. This makes it possible to filter most of the spontaneous emission of the laser, which is poorly polarized, on behalf of the stimulated emission, which is well polarized and whose the fibre maintains the polarization.

The two magnetooptical layers 11 and 13 are in this case simultaneously formed on support 16 by a process which minimizes alignment errors and which makes it possible to obtain a very small dispersion of the magnetooptical characteristics between these two layers, which constitutes an important advantage.

Figure 5:
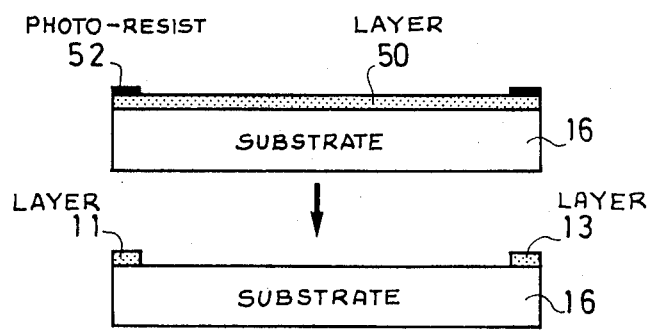
FIG. 5 an embodiment of the sensitive media of the gradientmeter of FIG. 3.

This process, illustrated in FIG. 5, consists of insulating two "islands" of the same crystalline layer 50 produced by epitaxy on a substrate which forms support 16. By chemically active, vacuum, ionic working, the epitaxial layer is eliminated, except at the two ends of the substrate masked by a metal deposit 52, e.g. of aluminium etched by photolithography. This procedure makes it possible to retain the quality of the reference plane of the two layers constituted by the plane of the substrate, which can be better than 1/10 of the optical fringe.

In an exemplified embodiment, this layer is of yttrium-iron garnet, substituted with gallium and gadolinium, which is applied by epitaxy to a polished gadolinium-gallium garnet substrate in order to obtain a flatness of a few dozen Angstroms. The two layers are spaced by 5 cm, have a width of 2 mm and a thickness of 30 microns.

The half-wave crystalline plate 12 is bonded to substrate 16 between the two layers. In order to obtain a perfect orientation, the direction of the incident polarization is adjusted once the plate has been fitted, by appropriately orienting laser 10 because the Faraday effect has not preferred direction.

In order to improve the light propagation in the free space between the layers and the half-wave plate, it is possible to use cylindrical microlenses and diaphragms in order to correct the divergence of the beam and prevent multiple paths. FIG. 3 shows a single lens 32 and a single diaphragm 36, placed between layer 11 and plate 12, but the appropriate number will be used, according to prior art procedures, as a function of the distance between the layers and the plate.

The divergence of the light beam leaving plate 13 is sufficiently small to make it possible to move away the photodetector 15, e.g. a photodiode, from said plate, so as to interpose polarizer 14 and coil 34 to be described hereinafter.

Photodetector 15 supplies a current $i_d$ making it possible to measure the gradient of the field between layers 11 and 13. In order to improve the accuracy of measurement of the gradient, a measuring method is used, whose principle is known in magnetometers. This principle consists of modulating the intensity $i_d$ by superimposing an a.c. magnetic field $h_e \sin \omega t$, called the excitation field, parallel to the propagation direction of the light beam. In the absence of a d.c. field in the propagation direction, intensity $i_d$ has a spectral response containing no even harmonics. In the presence of a d.c. field which varies slowly with respect to the frequency of the a.c. field, uneven harmonics appear in the spectral response of $i_d$ and in particular the fundamental of pulsation $\omega$.

With this aim the gradientmeter of FIG. 3 has two coils 30, 31, whose axes coincide with the propagation direction of the light beam. These coils are connected to an alternating current generator 35. The expressions of the Faraday rotations in the two layers are:

$$\theta = K(h_1 + \sin \omega t) \text{ and } \theta_2 = K(h_2 + h_e \sin (\omega t + \phi))$$

in which $\phi$ is the phase difference. In order to maximize the difference $\theta_2 - \theta_1$, the coils are fitted and supplied in phase opposition ($\phi \simeq \pi$), the two layers 11 and 13 then being excited in phase opposition.

The intensity $i_d$ at the output is proportional to $\sin^2 (\theta_1 - \theta_2)$. On noting that $\sin^2 (\theta_1 - \theta_2)$ is equal to $\frac{1}{2}(1 - \cos 2(\theta - \theta_2))$, and by developing in the Fourier series, the fundamental of pulsation $\omega$ is given by:

$$(i_d)_{107} = |E_o|^2 \sin K(h_1 - h_2) 2 J_1(4Kh_e) \sin \omega t e^{-2La}$$

$J_1$ being the Bessel function of the first type of order 1.

According to a constructional variant, it is possible to use a single excitational coil, either at layer 11, or at layer 13, but this reduces the sensitivity.

The signal $i_d$ is then applied to a bandpass filter 33 centred on $\omega$. This signal supplies a signal $(i_d)_\omega$ which, bearing in mind the fact that $K(h_1 - h_2)$ is small, is proportional to $h_1 - h_2$, i.e. to the gradient which it is wished to measure.

It is pointed out that the crossed analyzer 14 makes it possible to optically eliminate a large part of the d.c. component and consequently to enable photodetector 15 to operate in the optimum conditions from the noise standpoint. In a gradientmeter with lower performance characteristics, this analyzer could be eliminated.

In order to optimize the sensitivity of the device, it is possible to maximize the aptitude of the fundamental by making $J_1(4Kh_e)$ maximum by adjustment of the value of $h_e$ which is done by $4Kh_e \simeq 1.84$, which gives $h_e = (1.84 H_s/4\theta_o L)$.

In order to measure the gradient with the best possible precision, use is made of a zero method, which consists of superimposing on the local field of one of the layers a complementary field using a coil 34 through which flows a direct current $i_e$. This field tends to bring the resultant field in said layer to the value of the local value of the other layer, ie. by cancelling out the gradient. When the signal $(i_d)_\omega$ is cancelled out, (with the exception of the noise), the value of the direct current $i_e$ in the coil 34 gives the value of the gradient.

Figure 4:
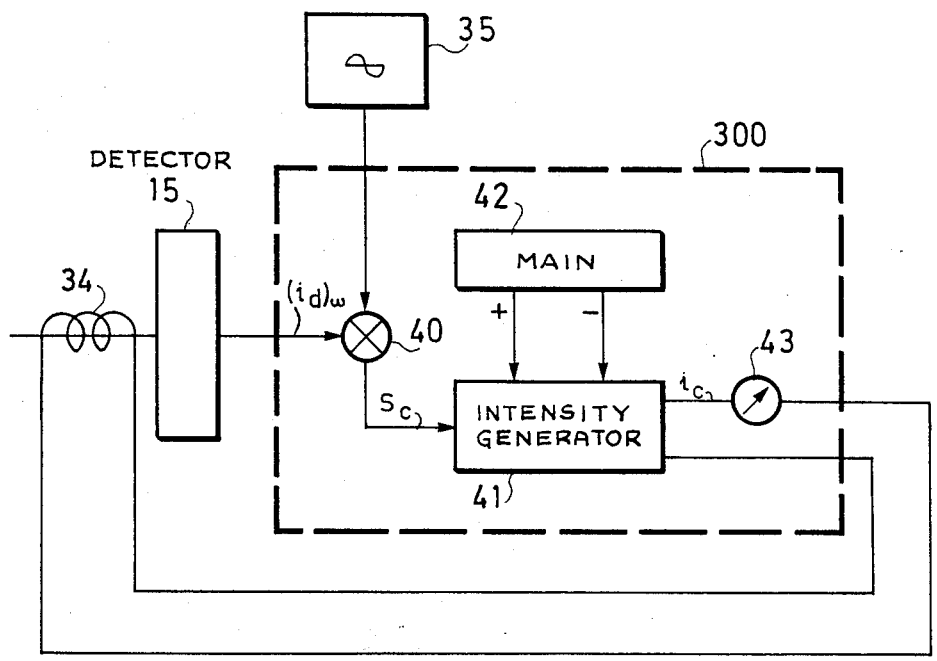
FIG. 4 is a diagram of the electrical detection system of the gradientmeter of FIG. 3.

The circuit 300, whose diagram is shown in FIG. 4, makes it possible to realize the zero method. A synchronous detector 40 on the one hand receives the signal $(i_d)_\omega$ and on the other the signal from generator 35. It supplies a control signal $S_c$ to a current generator 41 supplied by a stabilized supply 42. This generator supplies current $i_c$ to coil 34 and this current is measured by a galvanometer 43, which is graduated in gradient values.

According to a variant, the current $i_c$ is injected at two coils 30 or 31 and a transformer or capacitor placed between these two coils prevents the current $i_c$ from reaching the other coil. In the case of a gradientmeter with lower performance characteristics, signal $S_c$, which represents the gradient to be measured in modulus and in sign, is obtained by detection and integration of the signal $(i_d)_\omega$.

With the values referred to hereinbefore for the sensitive layers and for a saturation field $H_S = 80$ A/m, a modulating field $h_e = 40$ A/m and a modulation frequency of 10 kHz, it is possible to measure a gradient of 0.2 nT/m.

Such a magnetic field gradientmeter with this sensitivity, low overall dimensions and limited consumption is particularly suitable for being placed in a satellite or an underwater missile for use in a surveillance or classification system.

What is claimed is:

1. A device for measuring the gradient of a magnetic field by the magnetooptical effect and which comprises a source supplying a light beam linearly polarized in one propagation direction, a first magnetooptical medium immersed in the magnetic field, receiving the light beam and rotating its polarization plane, a half-wave plate having a neutral axis parallel to the polarization of the beam emitted by the source and receiving the beam transmitted by the first medium, a second magnetooptical medium immersed in the magnetic field, receiving the light beam transmitted by the half-wave plate, making its polarization plane rotate and supplying a light beam, whereof the angle of the polarization plane relative to the polarization plane of the beam emitted by the source is proportional to the component of the gradient of the magnetic field between the two media in the propagation direction of the light beam.

2. A device according to claim 1, wherein it also comprises a polarizer crossed with respect to the polarization of the beam emitted by the source and receiving the light beam supplied by the second medium, and a photodetector receiving the light beam transmitted by the polarizer and supplying a gradient measuring signal.

3. A device according to claim 1, wherein the two magnetooptical media are two fragments of a same thick monocrystalline layer of ferrimagnetic material applied by epitaxy to the same planar crystalline substrate.

4. A device according to claim 3, wherein the two fragments are obtained by ionic working of the thick layer.

5. A device according to claim 1, comprising means for applying magnetic modulating fields in phase opposition to the two media and means for measuring the gradient on the base of the uneven frequency components of the modulation generated in the output light beam.

6. A device according to claim 5, wherein it also comprises means for applying a negative feedback magnetic field to one of the media in order to cancel out the gradient and permit measurement by a zero method.

* * * * *